(12) United States Patent
Marrs et al.

(10) Patent No.: US 9,723,747 B1
(45) Date of Patent: Aug. 1, 2017

(54) EQUIPMENT MODULE SUPPORT BRACKETS, RACK-MOUNTED EQUIPMENT SYSTEMS, AND RELATED METHODS

(71) Applicant: VCE Company, LLC, Richardson, TX (US)

(72) Inventors: Samuel M. Marrs, Bradley, IL (US); Alva B. Eaton, Nottingham Park, IL (US)

(73) Assignee: VCE IP HOLDING COMPANY LLC, Richardson, TX (US)

( * ) Notice: Subject to any disclaimer, the term of this patent is extended or adjusted under 35 U.S.C. 154(b) by 21 days.

(21) Appl. No.: 14/740,207

(22) Filed: Jun. 15, 2015

(51) Int. Cl.
| | | |
|---|---|---|
| H05K 5/00 | (2006.01) | |
| H05K 7/00 | (2006.01) | |
| H05K 7/14 | (2006.01) | |
| H05K 7/20 | (2006.01) | |
| H05K 7/18 | (2006.01) | |

(52) U.S. Cl.
CPC ............ H05K 7/1489 (2013.01); H05K 7/18 (2013.01); H05K 7/20754 (2013.01)

(58) Field of Classification Search
CPC ......................... H05K 7/1489; H05K 7/20754
USPC ......................... 361/679.33–679.39, 724–727
See application file for complete search history.

(56) References Cited

U.S. PATENT DOCUMENTS

| | | | | |
|---|---|---|---|---|
| 5,791,498 A * | 8/1998 | Mills | ........................ | H02B 1/34 |
| | | | | 211/183 |
| 6,281,433 B1 * | 8/2001 | Decker | ................ | H05K 9/0015 |
| | | | | 174/394 |
| 6,422,399 B1 * | 7/2002 | Castillo | .................. | A47B 57/40 |
| | | | | 211/175 |
| 6,521,126 B2 * | 2/2003 | Wyness | ................ | B01D 24/205 |
| | | | | 210/277 |
| 6,601,932 B1 * | 8/2003 | Helgenberg | ........... | H02B 1/301 |
| | | | | 211/26 |
| 8,448,791 B2 * | 5/2013 | Zhang | ..................... | G06F 1/188 |
| | | | | 211/26 |
| 9,155,219 B2 * | 10/2015 | Watanabe | ............ | H05K 7/1488 |
| 2004/0104184 A1 * | 6/2004 | Hartman | .............. | A47B 88/044 |
| | | | | 211/26 |
| 2006/0081545 A1 * | 4/2006 | Rassmussen | ........ | H05K 7/1425 |
| | | | | 211/26 |
| 2010/0000950 A1 * | 1/2010 | Malekmadani | ...... | A47B 96/024 |
| | | | | 211/26 |
| 2015/0189787 A1 * | 7/2015 | Bailey | .................. | H05K 7/1489 |
| | | | | 361/679.48 |

* cited by examiner

*Primary Examiner* — Anthony Haughton
(74) *Attorney, Agent, or Firm* — Jenkins, Wilson, Taylor & Hunt, P.A.

(57) ABSTRACT

Equipment module support brackets, rack-mounted equipment cabinet systems, and related methods can include at least one equipment module, a rack-mounted equipment cabinet for storing the rack-mounted equipment, and at least one equipment module support bracket installed in the rack-mounted equipment cabinet for supporting the at least one equipment module stored in the rack-mounted equipment cabinet. The support bracket can include a longitudinally extending top face, and at least one aperture disposed on opposite ends of a rear facing longitudinal edge of the longitudinally extending top face. The support bracket can include a height of less than one (1) rack unit (RU) when mounted in the rack-mounted equipment cabinet. The support bracket can include at least one server support bracket for supporting a server.

20 Claims, 5 Drawing Sheets

EQUIPMENT MODULE SUPPORT BRACKETS, RACK-MOUNTED EQUIPMENT SYSTEMS, AND RELATED METHODS

TECHNICAL FIELD

The subject matter described herein relates generally to rack-mounted equipment modules. More specifically, the subject matter relates to equipment module support brackets, rack-mounted equipment systems, and related methods.

BACKGROUND

Currently, converged infrastructure (CI) network, storage, and computer systems are designed to transport as a fully deployed unit. Some equipment modules (e.g. servers) are not designed to support their own weight statically, which may be amplified when subjected to dynamic loading during transport. This may result in the equipment modules sagging at both ends due to lack of structural support in the equipment module itself. Equipment modules devoid of structural support may create a gap between the equipment module, itself, and other CI system equipment under both static and dynamic loading conditions. These gaps are problematic aesthetically and for operational and performance reasons. For example, the gaps may provide an air path funneling hot air to a front of the CI system, which changes a temperature of inlet air entering the equipment modules installed in the rack. This may cause the equipment modules to overheat, thereby creating an increase in operating temperatures causing the fans in the equipment modules to speed up to cool the units down. This change in temperature may require environmental controls to compensate for the additional heat load created by recirculation of hot air through these gaps. Depending on how severely the equipment modules are sagging, the performance of the equipment modules may decrease and operation cost may increase.

SUMMARY

Equipment module support brackets, rack-mounted equipment systems, and related methods are disclosed. According to one exemplary embodiment, a rack-mounted equipment system can comprise rack-mounted equipment including at least one equipment module (e.g., a server), a rack-mounted equipment cabinet for storing the rack-mounted equipment, and at least one equipment module support bracket installed in the rack-mounted equipment cabinet for supporting the at least one equipment module stored in the rack-mounted equipment cabinet. The equipment module support bracket can comprise a longitudinally extending top face, and at least one aperture disposed on opposite ends of a rear facing longitudinal edge of the longitudinally extending top face. Additionally, the equipment module support bracket can include a height of less than one (1) rack unit (RU) when mounted in the rack-mounted equipment cabinet.

BRIEF DESCRIPTION OF THE DRAWINGS

The subject matter described herein will now be explained with reference to the accompanying drawings of which.

DETAILED DESCRIPTION

Figure 1:
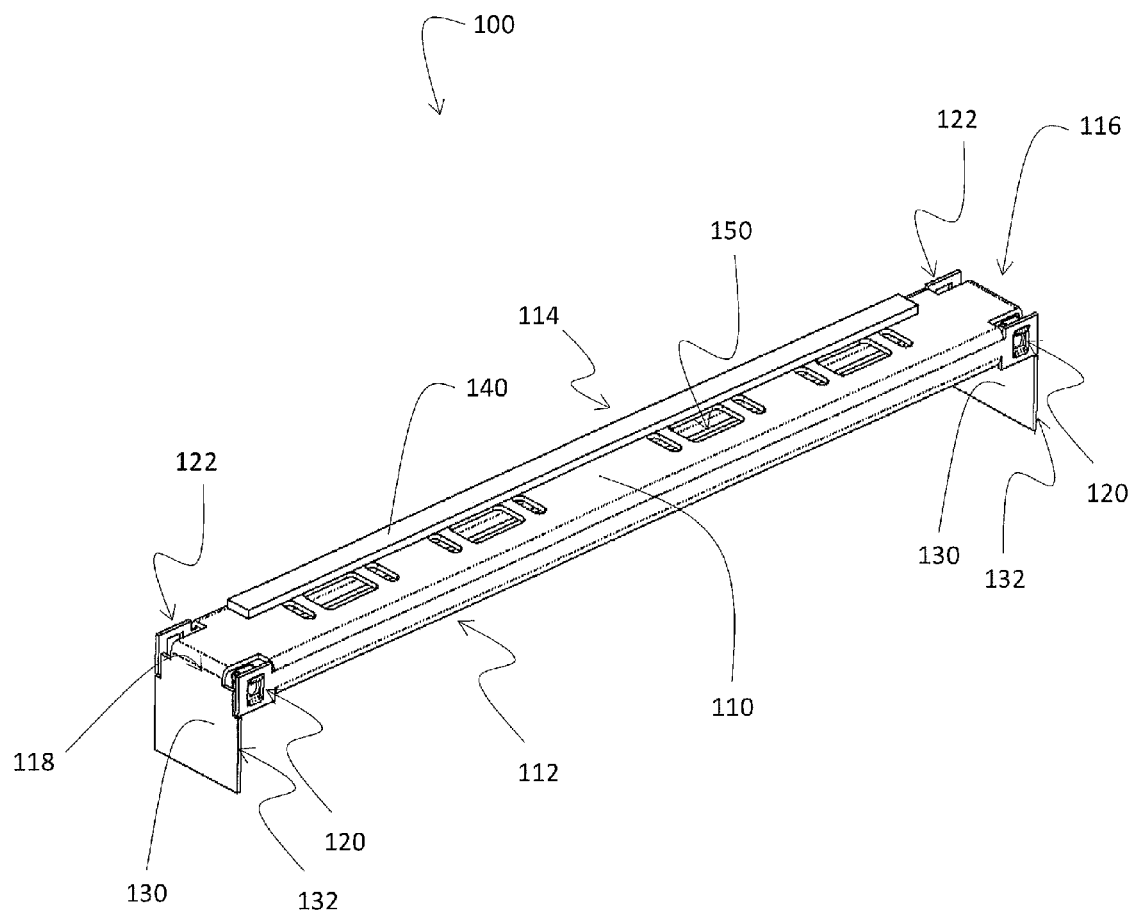
FIG. 1 is a perspective view illustrating an exemplary server support bracket according to an embodiment of the subject matter described herein.

The subject matter described herein discloses equipment module support brackets, rack-mounted equipment systems, and related methods for installing equipment module support brackets in rack-mounted equipment cabinets. In particular, the present subject matter discloses equipment module support brackets that are configured to be installed in rack-mounted equipment cabinets in order to maintain an airflow barrier between rack-mounted equipment (e.g., storage), as well as rack-mounted equipment modules (e.g., servers). In this regard, the present equipment module support brackets can be installed on existing, pre-configured rack-mounted equipment cabinets or installed during configuration of rack-mounted equipment cabinets. As a result, the present subject matter can reduce or eliminate sagging of equipment modules by maintaining a constant gap between such equipment modules and other rack-mounted equipment. Notably, by minimizing or maintaining a constant gap, an airflow barrier may be created in the rack-mounted equipment cabinet to separate the cool inlet air from the hot exhaust air and stop recirculation from exhaust outlets to inlets.

As used herein, "rack-mounted equipment" can comprise a "converged infrastructure system" or "CI system", such as Vblock® Systems by VCE Company, LLC. In some aspects, a CI system can comprise multiple components or elements associated with a preconfigured or prepackaged computing platform. For example, a CI system can comprise a computing platform or unit associated with racks of physical components and related software for performing virtualization and/or other functions. In some aspects, a CI system can comprise multiple components that include one or more computing components, software components, networking components, storage components, hardware components, and/or firmware components that can be stored in a rack-mounted equipment cabinet (e.g., a standardized customer 19" Electronic Industries Alliance (EIA) rack or an existing CI system cabinet). For example, an exemplary CI system can comprise equipment modules, data storage devices, servers, networking equipment, and software for managing physical resources and/or virtualized resources (e.g., virtual servers).

As used herein, "equipment module" can comprise a "server", "server element", "server module", or any "compute component" that is a server component, a CI component, or any like physical or hardware component.

As used herein, a "rack unit" or "RU" can comprise a region approximately 1.75 inches in height per the Electronic Industries Alliance (EIA) standards (e.g., EIA-310E) for frames or enclosures for mounting multiple equipment modules therein. Alternatively, in some embodiments, a "rack unit" or "RU" can comprise a region approximately 48 millimeters in height per the Open Rack Standard (e.g., OpenU) for frames or enclosures for mounting multiple equipment modules therein.

Reference will now be made in detail to exemplary embodiments of the subject matter described herein, examples of which are illustrated in the accompanying drawings. Wherever possible, the same reference numbers will be used throughout the drawings to refer to the same or like parts.

FIG. 1 is a perspective view illustrating an exemplary equipment module support bracket, according to an embodiment of the subject matter described herein. The equipment module support bracket can comprise a server support bracket, generally designated 100, configured to provide additional support to a rack-mounted equipment module, such as a server, while occupying less than one (1) RU of space in a rack-mounted equipment cabinet (see, e.g., 200, FIG. 2). In some aspects, server support bracket 100 can comprise a height of less than one RU when mounted in a rack-mounted equipment cabinet. For example, server support bracket 100 can comprise a height of zero (0) RUs, and thus, will not occupy any measurable RU space in a rack-mounted equipment cabinet. In other aspects, for example, server support bracket 100 can comprise a height of half (½) an RU. Additionally, server support bracket 100 can be configured as any other type of support bracket and the embodiment of server support bracket 100 is in no way limited to only supporting servers. Server support bracket 100 can also be configured to maintain a constant space or gap between a rack-mounted server and other rack-mounted equipment mounted below the server in order to prevent the server from sagging at either end. By preventing "soggy server", server support bracket 100 can maintain a cold and/or hot air barrier between the two pieces of equipment (see, e.g., FIG. 2).

In some aspects, server support bracket 100 can be configured to be installed in a standardized equipment cabinet or enclosure for mounting multiple equipment modules, such as, for example a 19" EIA rack, a 23" EIA rack, an Open Rack configured to support wider equipment modules of 537 mm, etc. The standardized equipment cabinet or enclosure can be a pre-configured or constructed enclosure already containing rack-mounted equipment or CI systems to which server support bracket 100 can be installed aftermarket. Alternatively, the standardized equipment cabinet or enclosure can be in the process of being configured or constructed during which time rack-mounted equipment or CI systems can be installed. Regardless, server support bracket 100 is configured to be readily installed in a rack-mounted equipment cabinet comprising standardized rack architecture.

In some aspects, server support bracket 100 can comprise a material configured to withstand static and dynamic load requirements. For example, static load requirements may require an ability of server support bracket 100 to withstand loads of up to 50 pounds (lbs.), while dynamic load requirements may require server support bracket 100 to support a static load while subjected to random vibration, drop and impact testing per International Safe Transit Association (ISTA) protocols. In some aspects, a material of the server support bracket 100 can comprise a metal or metallic material (e.g., aluminum (Al), steel, iron (Fe), alloys thereof, etc.), any non-metallic material (e.g., plastic, polymeric, etc.), and/or any combinations thereof.

In some aspects, server support bracket 100 can comprise a longitudinally extending top face 110 having a length compatible with a standard rack-mounted equipment cabinet. For example, server support bracket 100 can comprise a length compatible with a 19" EIA rack. Longitudinally extending top face 110 can also comprise a height that enables server support bracket 100 to be installed within a rack-mounted equipment cabinet in such a way as to occupy minimal rack space. For example, server support bracket 100 can comprise a height of approximately 0.125 inches, such that when server support bracket 100 is installed in a standard rack-mounted equipment cabinet (e.g., a 19" EIA rack), server support bracket 100 occupies 0 RUs of space. In other words, server support bracket 100 can occupy a space between rack-mounted equipment, thereby not occupying a standard rack unit of space within the equipment cabinet (see, e.g., FIG. 2).

Figure 2:
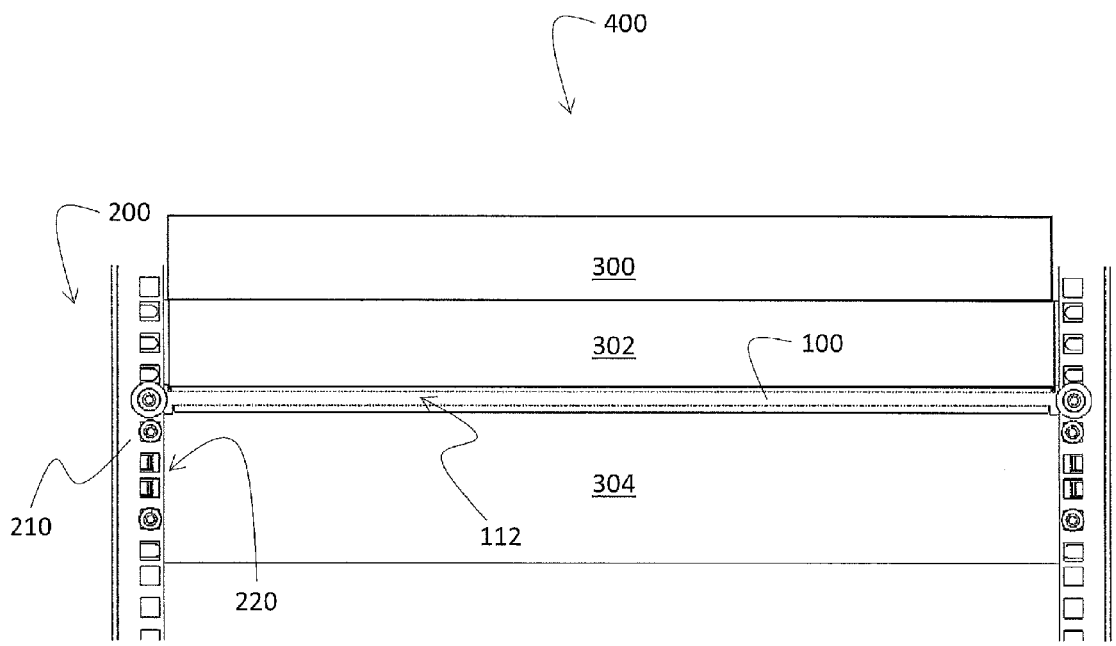
FIG. 2 is a rear view illustrating an exemplary rack-mounted equipment system comprising a server support bracket installed in a rack-mounted equipment cabinet according to an embodiment of the subject matter described herein.

Longitudinally extending top face 110 can comprise at least one aperture 120 disposed on opposite ends of a rear facing longitudinal edge 112 of longitudinally extending top face 110 for mounting server support bracket 100 in a standard equipment cabinet rail (see, e.g., 210, FIG. 2). Optionally, longitudinally extending top face 110 can comprise at least one aperture 122 disposed on a front facing longitudinal edge 114 of longitudinally extending top face 110 for mounting other cable management products. For example, as illustrated in FIG. 1, four apertures are shown on longitudinally extending top face 110, where two apertures 120 are disposed on opposite ends of rear facing longitudinal edge 112 of longitudinally extending top face 110 and two apertures 122 are disposed on front facing longitudinal edge 114 of longitudinally extending top face 110.

In some aspects, at least one aperture 120, as well any optional apertures 122, can be configured as a square hole in order to receive a fastener 124 (see, e.g., FIGS. 3C-3D) for mounting server support bracket 100 to an equipment cabinet rail. In some aspects, fastener 124 can be a threaded fastener (e.g., a bolt and washer combination), while in other aspects fastener 124 can be a boltless fastener (e.g., a cage nut). In other aspects, at least one aperture 120, as well any optional apertures 122, can be configured as a circular, rectangular, other shaped hole, etc., in order to receive a correspondingly shaped fastening element (not shown) for mounting server support bracket 100 to an equipment cabinet rail.

Longitudinally extending top face 110 can also comprise a first adjacent side edge 116 and a second adjacent side edge 118 each opposingly disposed between rear facing longitudinal edge 112 and front facing longitudinal edge 114. In some aspects, an adjacent side face 130 can be disposed substantially orthogonal to longitudinally extending top face 110 at first adjacent side edge 116 and/or second adjacent side edge 118 to provide loading support when equipment module support bracket 100 is mounted to an equipment cabinet rail. More particularly, adjacent side face 130 can be configured with edges 132 that drive against equipment rails of the rack-mounted equipment cabinet in order to distribute loads into the equipment rails when the equipment modules are installed. This additional support by adjacent side faces 130 may contribute to the structural foundation that prevents the supported equipment module from sagging. As illustrated in FIG. 1, for example, adjacent side faces 130 may be square-shaped flanges that are integral with longitudinally extending top face 110 and are bent in a plane substantially perpendicular to a plane in which longitudinally extending top face 110 extends. In other aspects, adjacent side faces 130 can be separately manufactured components from longitudinally extending top face 110 and can be composed of a metal or metallic material (e.g., aluminum (Al), steel, iron (Fe), alloys thereof, etc.), any non-metallic material (e.g., plastic, polymeric, etc.), and/or any combinations thereof. In other aspects, adjacent side faces 130 can be alternatively sized, shaped, etc.

In some aspects, a pad 140 can be disposed on longitudinally extending top face 110 for substantially reducing or eliminating vibration between server support bracket 100 and an equipment module (e.g., server) which bracket 100 supports. For example, as illustrated in FIG. 1, pad 140 is disposed on longitudinally extending top face 110 adjacent to front facing longitudinal edge 114. Alternatively, for example, pad 140 can be disposed on longitudinally extending top face 110 adjacent to rear facing longitudinal edge 112. In some aspects, pad 140 can be composed of a vibration absorbing material, such as, for example, elastomers (e.g., rubber), polymers with viscoelasticity, and/or other highly resilient materials.

In some aspects, one or more slots 150 can be disposed on longitudinally extending top face 110 for threading hook and loop straps through and/or managing cabling exiting the rear of an equipment cabinet. One or more slots 150 can be sized and/or shaped to accommodate such cabling.

Accordingly, one of ordinary skill in the art will understand that the above description of server support bracket 100 is one exemplary embodiment of such a bracket and is in no way a limit to size, shape, material, etc., of the subject matter described herein.

Regarding FIG. 2, a rear view of a rack-mounted equipment cabinet system 400 is illustrated. In some aspects, rack-mounted equipment cabinet system 400 can comprise an equipment module support bracket. In particular, for example, and as illustrated in FIG. 2, the equipment module support bracket can comprise a server support bracket 100 as described hereinabove with regard to FIG. 1. Rack-mounted equipment cabinet system 400 can further comprise a rack-mounted equipment cabinet 200 and rack-mounted equipment 300.

Rack-mounted equipment cabinet 200 can comprise any standardized enclosure or frame configured to hold rack-mounted equipment 300, such as, for example, elements of CI systems, including components and/or other physical resources. In some aspects, for example, elements of CI systems including compute components, networking components, storage components, and/or hardware components, including all or any combination thereof. For example, an exemplary CI system can comprise equipment modules, data storage devices, servers, switches, and networking equipment for managing physical resources and/or virtualized resources (e.g., virtual servers). In addition, equipment cabinet 200 can support data protection offerings and pre-packaged upgrades.

When mounted, typical rack-mounted equipment 300 can occupy an integer number of RUs in a standardized rack, such as a standard EIA 19" rack, although some equipment may occupy a fractional RU. Typically, when a piece of rack-mounted equipment 300 is designated as occupying a certain RU this can take into account a front panel height of 0.031 inches. For example, a 1 RU computer is not 1.75 inches tall, but is 1.719 inches tall. Accordingly, in combination with other tolerances a clearances, a gap or space of up to 0.25 inches between each installed piece of equipment can be formed, which can be beneficial for removing individual pieces of components, while not disturbing others. However, this gap or space can also allow rack-mounted equipment, especially equipment modules (e.g., servers), to bend or sag in their middles due to lack of support. The result is an equipment module that is mounted in a manner that a center of the equipment module bows downward, such that the equipment appears damaged or installed incorrectly. In addition, the bend or sag in the middle of the equipment module can form an undesirable gap between the middle of the equipment module and the adjacently-mounted pieces of rack-mounted equipment, which creates an air path from hot to cold. Specifically, this air path can facilitate hot air passing to a front of the equipment cabinet, which can increase a temperature of the inlet air drawn into the rack-mounted equipment and cause the equipment to overheat.

Typical solutions to this problem have included mounting rack-mounted support shelves beneath the piece of sagging equipment in order to bolster the sagging middle of the piece of equipment and maintain the hot/cold barrier between the above and below pieces of equipment. However, such rack-mounted support shelves may occupy up to 4 RUs of space in a standard equipment cabinet only having a total height of 42 RUs. Thus, space in a standard equipment cabinet is clearly a highly desirable commodity.

By comparison, FIG. 2 illustrates system 400 that utilizes a 0 RU equipment module support bracket installed in a rear of rack-mounted equipment cabinet 200 below an equipment module. Notably, the equipment module can comprise a server 302. Thus, the 0 RU equipment module support bracket can be a server support bracket 100 that is configured to support server 302 and thereby maintain a gap between server 302 and a piece of rack-mounted equipment 300 installed above server 302 and a storage equipment unit (e.g., Disk Array Enclosures (DAE) storage equipment unit 304) installed below server 302. In particular, by supporting server 302 bracket 100 can maintain a disposition of the items of rack-mounted equipment such that the gap is minimized and/or maintained; thereby preventing cross-contamination of cold and hot air.

In some aspects, rack-mounted equipment cabinet 200 can comprise vertical rails 210 to which rack-mounted equipment can be bolted or otherwise fastened thereto. For example, where equipment cabinet 200 comprises a substantially square shape, rails 210 may be disposed at each of the four corners of cabinet 200. In some aspects, rails 210 may comprise a plurality of holes. For example, rails 210 illustrated in FIG. 2 comprise a plurality of evenly spaced square-holes to allow for boltless mounting, using for example, fasteners 124. Where rails 210 are utilized in a standardized equipment rack, such as, for e.g., a standard EIA 19" rack, each of the square-holes can be disposed approximately 0.625 inches apart from center to center.

In some aspects, certain pieces of rack-mounted equipment may require separate mounting brackets that mount to the piece of equipment and also to the equipment cabinet in order to provide extra support and/or slideability of the piece of equipment. For example, FIG. 2 illustrates a rack-mounted piece of equipment, DAE storage equipment unit 304, mounted to an inside face of rails 210 using at least one DAE storage mounting bracket 220. DAE storage mounting bracket 220 may be removably mounted to cabinet 200 using DAE mounting bolts (see, e.g., 222, FIGS. 3A-3B). Other types of rack-mounted equipment (e.g., 300) may also comprise specialized mounting brackets (not shown) for mounting onto cabinet 200.

FIGS. 3A-3D illustrate an exemplary procedure for installing server support bracket 100 in a rack-mounted equipment cabinet 200 in order to form system 400, which is illustrated in FIG. 2. One of ordinary skill in the art will note that this procedure is exemplary only to a system pre-configured with the rack-mounted equipment illustrated in FIG. 2.

Figure 3A:
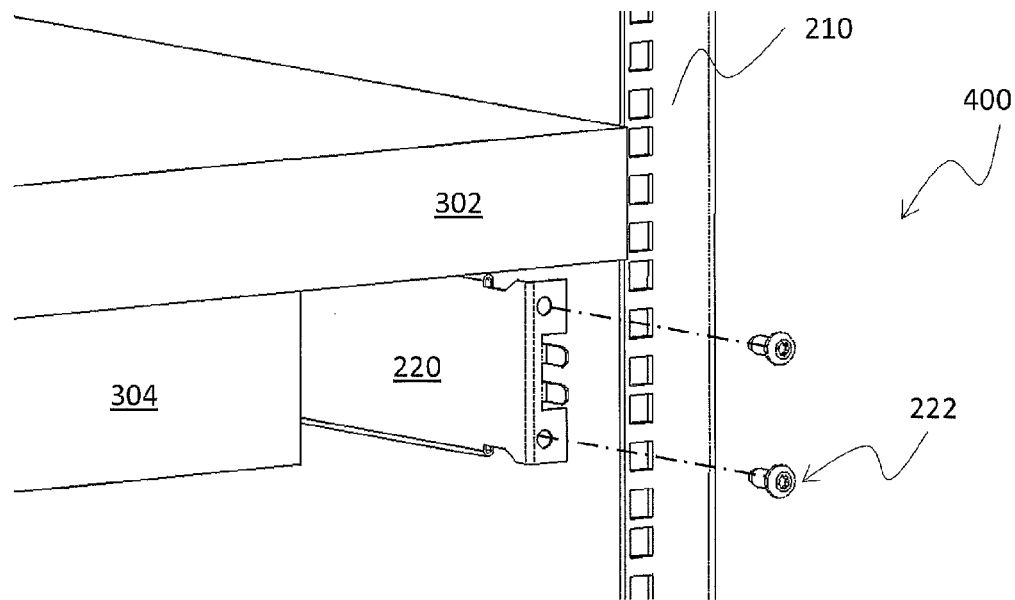
FIGS. 3A-3D are perspective views illustrating an exemplary procedure for installing a server support bracket in a rack-mounted equipment cabinet to support a server according to an embodiment of the subject matter described herein.

FIG. 3A illustrates a first stage in which DAE storage bolts 222 are removed from a first rail 210 and from a second rail 210 (e.g., FIG. 2). Bolts 222 may also be removed from two more rails 210 (not shown). As discussed above, DAE storage bolts 222 may be utilized to removably retain DAE storage mounting bracket 220 against rails 210 of cabinet 200. By removing bolts 222 from each rail, DAE storage mounting bracket 220 and DAE storage equipment unit 304 can be slid away from rails 210 to provide access to a region directly beneath server 302 for installation of bracket 100.

Figure 3B:
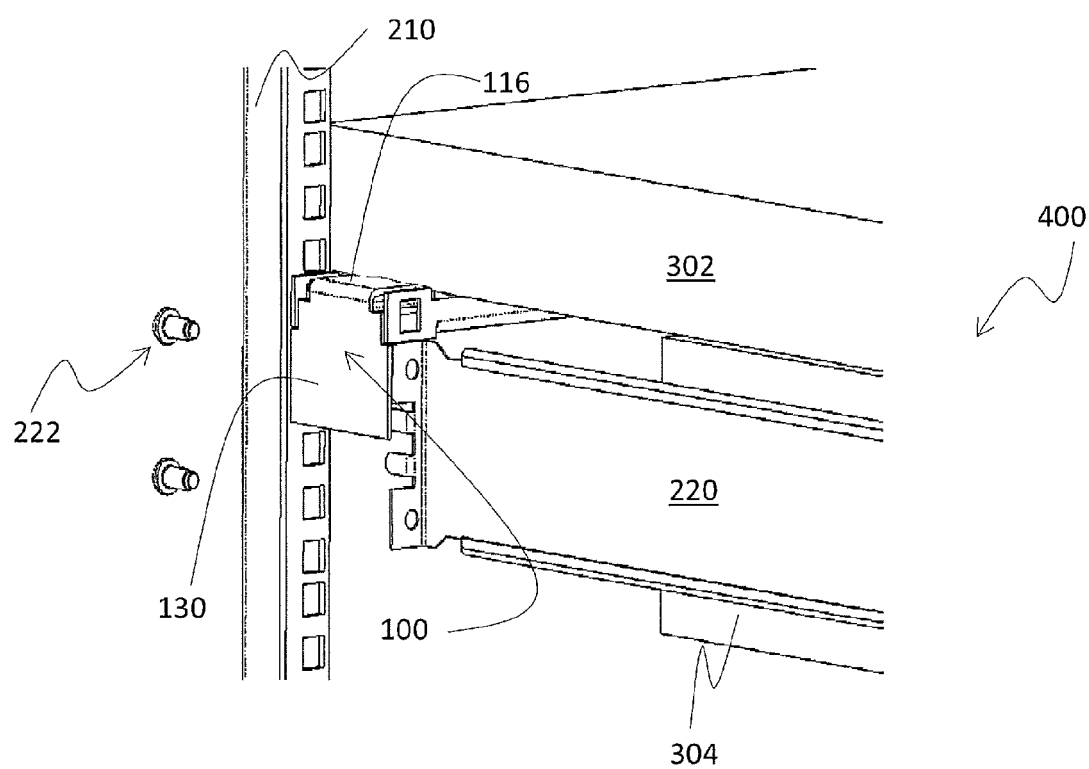

FIG. 3B illustrates a second stage in which bracket 100 is installed in cabinet 200. Notably, bracket 100 is positioned directly underneath server 302, such that longitudinally extending top surface 110 of bracket 100 is positioned adjacent to a bottom surface of server 302 and a rear facing longitudinal edge 112 of bracket 100 faces directly towards a rear of cabinet 200, while front facing longitudinal edge 114 of bracket 100 faces towards an interior of cabinet 200. When bracket 100 is positioned in such a manner, first adjacent side edge 116 and second adjacent side edge 118 of bracket 100 can be positioned substantially orthogonal to an inside face of rail 210. Adjacent side edges 130 may be disposed in such a manner that edges 132 will drive against an inside surface of rail 210 for additional structural support of bracket 100 from torque loads. At least one aperture 120 can be aligned with a first available hole of rail 210 under server 302.

Figure 3C:
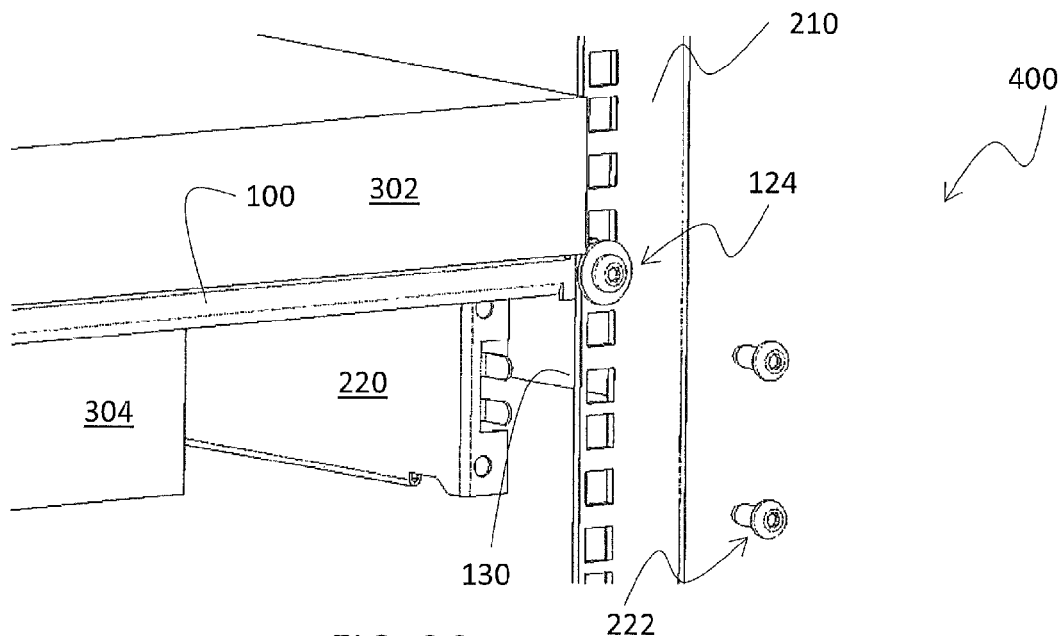

FIG. 3C illustrates a third stage in which bracket 100 is mounted to the inside face of cabinet rail 210 using a fastener 124. As illustrated in FIG. 3C, fastener 124 is a threaded fastener (such as a bolt) and a washer. This mounting stage can be repeated at the other rail 210 (e.g., FIG. 2). In some aspects, (not shown), a boltless fastening mechanism (e.g., a cage nut) can be used to mount bracket 100 to rail 210. Notably, when bracket 100 is mounted to rails 210 in this manner bracket occupies 0 RUs of rack space.

Figure 3D:
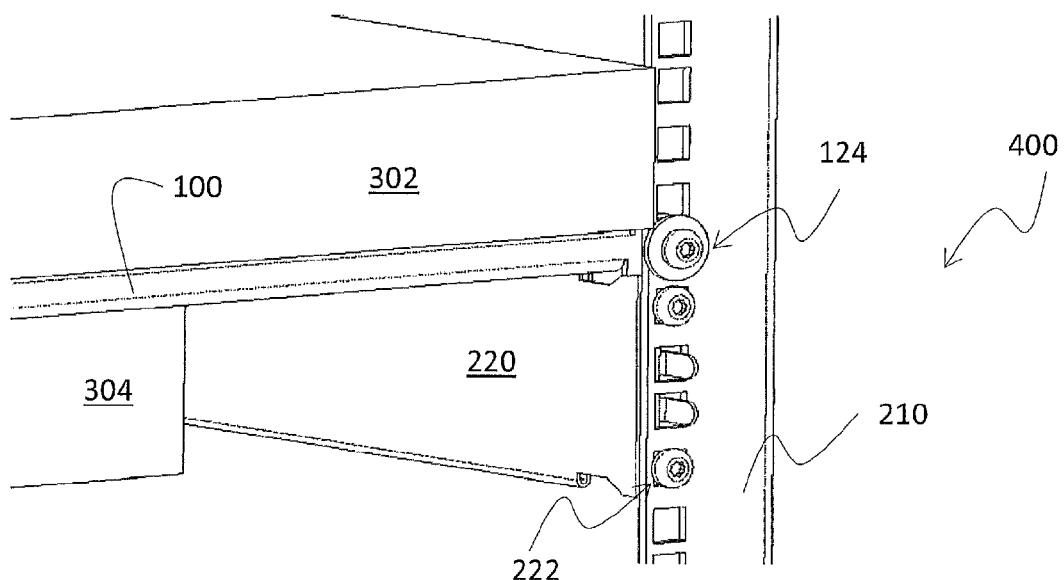

FIG. 3D illustrates a fourth stage in which DAE storage mounting bracket 220 is repositioned on an inner face of rails 210 and DAE storage bolts 222 are used to re-bolt or otherwise re-fasten DAE storage mounting bracket 220 to rails 210. In some aspects, DAE storage mounting bracket 220 can be repositioned so that holes on DAE storage mounting bracket 220 align with the rail holes under bracket 100. In some aspects, DAE storage mounting bracket 220 can be positioned such that it is adjacent to an inner face of first adjacent side edge 116 and second adjacent side edge 118. After installation of DAE storage mounting bracket 220, DAE storage equipment unit 304 can be re-mounted to cabinet 200. Accordingly, bracket 100 can be installed on a preconfigured rack-mounted equipment cabinet having rack-mounted equipment already installed in order to support rack-mounted equipment (such as a server).

Figure 4:
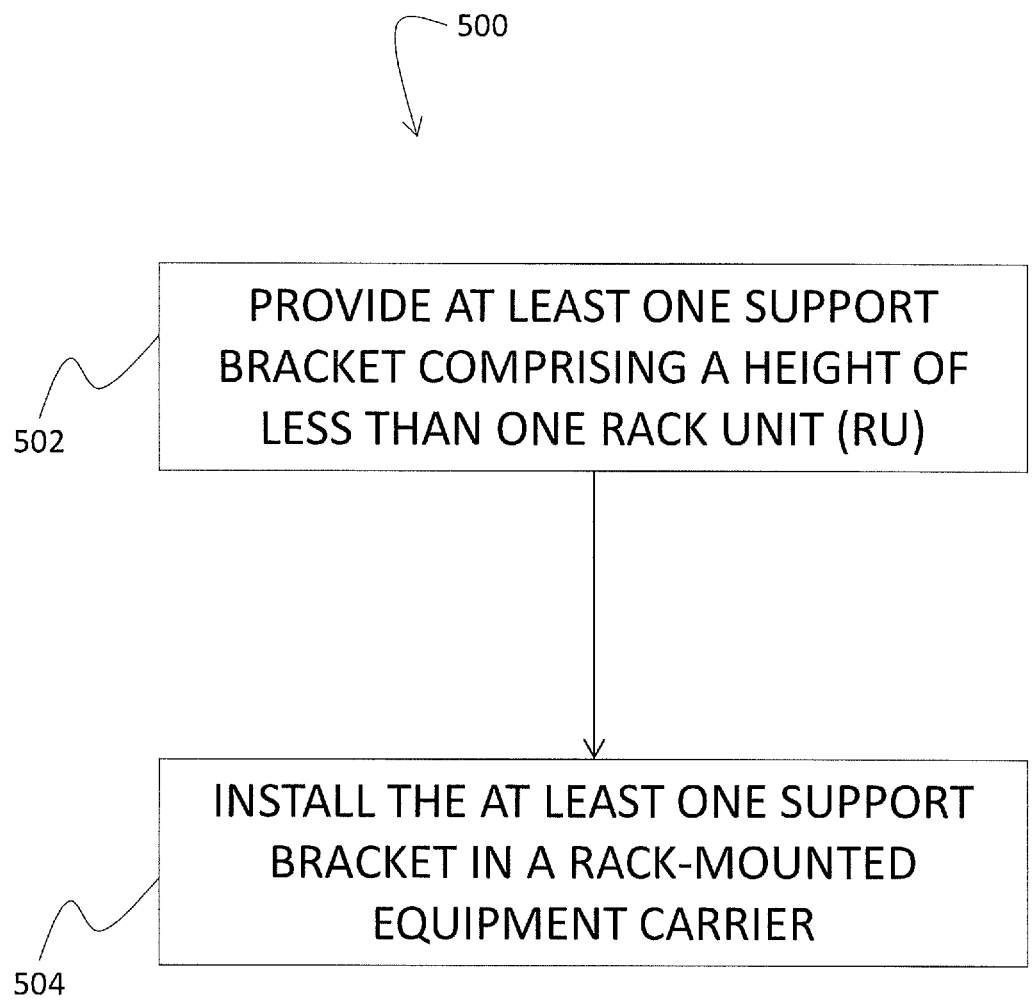
FIG. 4 is a flow diagram illustrating an exemplary method for installing an equipment module support bracket in a rack-mounted equipment cabinet according to an embodiment of the subject matter described herein.

FIG. 4 is a flow chart depicting an exemplary method, generally designated 500, for installing at least one equipment module support bracket 100 in a rack-mounted equipment cabinet 200. In some aspects, more than one support bracket 100 may be installed in cabinet 200, the cabinet comprising EIA-310E standardized rack requirements. In some aspects, the at least one equipment module support bracket 100 can comprise a server support bracket for supporting a server module 302 (see, FIGS. 1-3D).

Referring to FIG. 4, in block 502, the at least one equipment module support bracket 100 can be provided. In some aspects, equipment module support bracket 100 can comprise a height of 0 RUs. In some aspects, at least one equipment module support bracket 100 can comprise a longitudinally extending top face 110, and at least one aperture 120 disposed on opposite ends of a rear facing longitudinal edge 112 of longitudinally extending top face 110.

In some aspects, bracket 100 can comprise at least one additional aperture 122 disposed on a front facing longitudinal edge 114 of longitudinally extending top face 110 for mounting other cable management products (not shown).

In some aspects, bracket 100 can comprise a material that can withstand loads of up to 40 pounds (lbs.).

In block 504, at least one equipment module support bracket 100 can be installed in rack-mounted equipment cabinet 200 such that at least one equipment module support bracket 100 occupies 0 RUs in rack-mounted equipment cabinet 200.

In some aspects, at least one equipment module support bracket 100 can be mounted at a rear of rack-mounted equipment cabinet 200 between equipment rails 210. For example, bracket 100 can be mounted at a first end to an inside face of a first equipment rail 210 and at a second end to an inside face of a second equipment rail 210.

In some aspects, at least one equipment module support bracket 100 can be mounted directly above a storage bracket. For example, storage bracket can comprise a DAE storage mounting bracket 220.

In some aspects, at least one equipment module support bracket 100 can be mounted in such a manner as to maintain and minimize a gap between at least one equipment module 302 and the rack-mounted equipment 300, 304 mounted adjacent to at least one equipment module 302 in order to maintain an airflow barrier therebetween.

Accordingly, it will be appreciated that exemplary process 500 is for illustrative purposes and that different and/or additional actions may be used. It will also be appreciated that various actions described herein may occur in a different order or sequence.

It will be understood that various details of the subject matter described herein may be changed without departing from the scope of the subject matter described herein. Furthermore, the foregoing description is for the purpose of illustration only, and not for the purpose of limitation, as the subject matter described herein is defined by the claims as set forth hereinafter.

What is claimed is:

1. An equipment module support bracket for supporting an equipment module stored in a rack-mounted equipment cabinet, the equipment module support bracket comprising:
   a longitudinally extending top face configured to be positioned adjacent to a bottom surface of the equipment module to prevent the equipment module from sagging; and
   at least one aperture disposed on opposite ends of a rear facing longitudinal edge of the longitudinally extending top face for mounting the equipment module support bracket to the rack-mounted equipment cabinet;
   wherein the equipment module support bracket comprises a height of less than one (1) rack unit (RU) when mounted in the rack-mounted equipment cabinet.

2. The equipment module support bracket of claim 1, wherein the equipment module support bracket is configured as a server support bracket for supporting a server module and is configured to be mounted directly above at least one Disk Array Enclosure (DAE) storage bracket.

3. The equipment module support bracket of claim 1, wherein the equipment module support bracket is configured to be mounted at a rear of the rack-mounted equipment cabinet between equipment rails of the rack-mounted equipment cabinet, such that the equipment module support bracket is mounted at a first end to an inside face of a first equipment rail and at a second end to an inside face of a second equipment rail.

4. The equipment module support bracket of claim 1, wherein the equipment module support bracket is configured to maintain a gap between the equipment module and rack-mounted equipment mounted adjacent to the equipment module in order to maintain an airflow barrier therebetween.

5. The equipment module support bracket of claim 1, wherein the equipment module support bracket is comprised of a material configured to withstand static and dynamic load requirements.

6. The equipment module support bracket of claim 1, further comprising a pad disposed on the longitudinally extending top face for eliminating vibration between the equipment module support bracket and the equipment module.

7. The equipment module support bracket of claim 1, comprising a side face extending from a side edge of the equipment module support bracket and disposed substantially orthogonal to the longitudinally extending top face;
wherein the side face is configured to engage an equipment rail of the rack-mounted equipment cabinet.

8. A rack-mounted equipment system comprising:
a rack-mounted equipment cabinet;
rack-mounted equipment including at least one equipment module mounted to the rack-mounted equipment cabinet; and
at least one equipment module support bracket installed in the rack-mounted equipment cabinet for providing additional support to the at least one equipment module stored in the rack-mounted equipment cabinet, the at least one equipment module support bracket comprising:
a longitudinally extending top face positioned adjacent to a bottom surface of the equipment module to prevent the at least one equipment module from sagging; and
at least one aperture disposed on opposite ends of a rear facing longitudinal edge of the longitudinally extending top face;
wherein the at least one equipment module support bracket comprises a height of less than one (1) rack unit (RU) when mounted in the rack-mounted equipment cabinet.

9. The rack-mounted equipment system of claim 8, wherein the at least one equipment module support bracket is configured as a server support bracket for supporting a server module and is configured to be mounted directly above at least one Disk Array Enclosure (DAE) storage bracket.

10. The rack-mounted equipment system of claim 8, wherein the at least one equipment module support bracket is configured to be mounted at a rear of the rack-mounted equipment cabinet between equipment rails of the rack-mounted equipment cabinet, such that the at least one equipment module support bracket is mounted at a first end to an inside face of a first equipment rail and at a second end to an inside face of a second equipment rail.

11. The rack-mounted equipment system of claim 8, wherein the at least one equipment module support bracket is configured to maintain a gap between the at least one equipment module and rack-mounted equipment mounted adjacent to the at least one equipment module in order to maintain an airflow barrier therebetween.

12. The rack-mounted equipment system of claim 8, wherein the equipment module support bracket is comprised of a material configured to withstand static and dynamic load requirements.

13. The rack-mounted equipment system of claim 8, wherein the at least one server support bracket further comprises a pad disposed on the longitudinally extending top face for eliminating vibration between the at least one equipment module support bracket and the at least one equipment module.

14. The rack-mounted equipment system of claim 8, comprising a side face extending from a side edge of the equipment module support bracket and disposed substantially orthogonal to the longitudinally extending top face;
wherein the side face is configured to engage an equipment rail of the rack-mounted equipment cabinet.

15. A method for installing at least one equipment module support bracket in a rack-mounted equipment cabinet, the method comprising:
positioning at least one equipment module support bracket beneath an equipment module mounted in the rack-mounted equipment cabinet such that a longitudinally extending top face of the at least one equipment module support bracket is positioned adjacent to a bottom surface of the equipment module, the at least one equipment module support bracket comprising a height of less than one (1) rack unit (RU) when mounted in the rack-mounted equipment cabinet, and at least one aperture is disposed on opposite ends of a rear facing longitudinal edge of the longitudinally extending top face; and
installing the at least one equipment module support bracket in the rack-mounted equipment cabinet.

16. The method of claim 15, wherein the at least one equipment module support bracket supports a server module, such that installing the at least one equipment module support bracket in the rack-mounted equipment cabinet comprises mounting the at least server support bracket directly above at least one Disk Array Enclosure (DAE) storage bracket.

17. The method of claim 15, wherein installing the at least one equipment module support bracket in the rack-mounted equipment cabinet comprises mounting the at least one equipment module support bracket at a rear of the rack-mounted equipment cabinet between equipment rails of the rack-mounted equipment cabinet, such that the at least one equipment module support bracket is mounted at a first end to an inside face of a first equipment rail and at a second end to an inside face of a second equipment rail.

18. The method of claim 15, wherein installing the at least one equipment module support bracket in the rack-mounted equipment cabinet comprises mounting the at least one equipment module support bracket to maintain a gap between the at least one equipment module and rack-mounted equipment mounted adjacent to the at least one equipment module in order to maintain an airflow barrier therebetween.

19. The method of claim 15, wherein the equipment module support bracket is comprised of a material configured to withstand static and dynamic load requirements.

20. The method of claim 15, wherein positioning at least one equipment module support bracket beneath an equipment module comprises engaging an equipment rail of the rack-mounted equipment cabinet with a side face of the equipment module support bracket, wherein the side face extends from a side edge of the equipment module support bracket and is disposed substantially orthogonal to the longitudinally extending top face.

\* \* \* \* \*